United States Patent [19]
Jones

[11] Patent Number: 5,764,657
[45] Date of Patent: Jun. 9, 1998

[54] METHOD AND APPARATUS FOR GENERATING AN OPTIMAL TEST PATTERN FOR SEQUENCE DETECTION

[75] Inventor: Christopher W. Jones, Pleasanton, Calif.

[73] Assignee: Cypress Semiconductor Corp., San Jose, Calif.

[21] Appl. No.: 826,882

[22] Filed: Apr. 7, 1997

Related U.S. Application Data

[63] Continuation of Ser. No. 660,932, Jun. 10, 1996, abandoned.

[51] Int. Cl.$^6$ .................................................. G01R 31/28
[52] U.S. Cl. .................... 371/27.1; 371/22.33; 364/717
[58] Field of Search .......................... 371/27.1, 27.2, 371/67.1, 22.33, 24; 324/158.1, 73.1; 364/717

[56] References Cited

U.S. PATENT DOCUMENTS

| 5,144,230 | 9/1992 | Katoozi et al. | 324/158 |
|---|---|---|---|
| 5,258,986 | 11/1993 | Zerbe | 371/21.2 |
| 5,383,143 | 1/1995 | Crouch et al. | 364/717 |
| 5,390,192 | 2/1995 | Fujieda | 371/27 |
| 5,541,942 | 7/1996 | Strouss | 371/21.3 |
| 5,568,437 | 10/1996 | Jamal | 365/201 |

OTHER PUBLICATIONS

Mississippi State University, *EE3111 Digital Devices Design Laboratory Manual*, Fourth Edition, (Jan. 1994).

*Primary Examiner*—Hoa T. Nguyen
*Attorney, Agent, or Firm*—Blakely, Sokoloff, Taylor & Zafman LLP

[57] ABSTRACT

A method for generating an optimal serial test pattern for sequence detection. The serial test pattern comprises a first plurality of bits and is generated by a pattern generator. The method comprises generating a second plurality of bits having a first value and a least significant bit. The second plurality of bits includes less bits than the first plurality of bits. The first value of the second plurality of bits is then compared with at least one number. A next bit is then generated in the serial pattern. If the first value of the second plurality of bits is equal to the at least one number, the next bit has a same state as the least significant bit in the second plurality of bits. If the second plurality of bits is not equal to the at least one number, the next bit has a complement state of the least significant bit in the second plurality of bits. For one embodiment, the second plurality of bits comprises n bits, and the at least one number comprises one through $2^{n-1}$ inclusive. For another embodiment, the at least one number comprises $2^{n-1}-1$ through $2^n-2$ inclusive.

1 Claim, 5 Drawing Sheets

METHOD AND APPARATUS FOR GENERATING AN OPTIMAL TEST PATTERN FOR SEQUENCE DETECTION

This is a continuation of application application Ser. No. 08/660,932, filed Jun. 10, 1996, now abandoned.

BACKGROUND OF THE INVENTION

1. Field of the Invention

The present invention relates to test pattern generation and detection. More particularly, the present invention relates to a method and apparatus for generating a test pattern for testing a sequence detection state machine or other circuitry in an electronic device.

2. Background of the Invention

Many electronic devices (e.g. integrated circuits, systems, etc.) have a circuit that receives a serial input stream of data and performs an action in response to the serial input stream.

An electronic device may include a sequence detecting state machine that constantly monitors and evaluates the serial input stream. When a particular pattern is detected in the serial input stream, the sequence detecting state machine causes the electronic device to perform an action. For example, the electronic device may latch data provided on an input bus when the sequence detecting state machine determines that the serial input stream includes a bit pattern that instructs the electronic device to load input data.

When the sequence detecting state machine does not recognize a pattern in the serial input stream, the sequence detecting state machine does not instruct the electronic device to perform an action.

Typically, the serial input stream of data is stored in a register that can then be read by the sequence detecting state machine or by another circuit within the electronic device. Without the use of a sequence detecting state machine, the other circuit may perform an action in response to the serial input stream. For example, the other circuit may comprise an addressable memory circuit and the register may comprise an address register. The address register may be serially loaded with address information of an addressable memory location in the memory circuit. If the address register comprises n bits, there are $2^n$ possible n-bit address locations that can be loaded into the address register. The serial input stream may comprise all $2^n$ possible n-bit addresses to test that each address may be properly selected.

If the sequence detecting state machine or other circuit responds to or evaluates an n-bit pattern in the serial stream of data, then in order to completely test whether the sequence detecting state machine or other circuit is functioning properly, $2^n$ unique patterns must be supplied to the electronic device. The response of the sequence detecting state machine, other circuitry, and the electronic device must be monitored for each of the $2^n$ unique patterns.

Each unique n-bit pattern may be separately provided to the electronic device. This technique, however, would require a minimum of $n \times 2^n$ cycles to load all n-bit patterns into the electronic device. For example, if n equals three, then it would be possible in 24 cycles ($3 \times 2^3$) to provide to the electronic device the patterns of 000, 001, 010, . . . , 111.

A serial pattern for supplying the 64 combinations of a six-bit pattern has been used to test a sequence detecting state machine which monitors six-bit patterns. The serial pattern comprises:
0000001111110101011001101110110100100111000101111 0010100011000100000.

However, a method of generating this serial pattern has not been known by others.

It is desirable to generate an optimal serial input stream including all possible n-bit patterns and requiring less than $n \times 2^n$ cycles to serially load into an electronic device. It is also desirable to have the serial input stream be as short as possible to save time in loading the serial input stream into an electronic device under test. Additionally, it is desirable to have a short serial input stream to save time in testing a sequence detecting state machine or other circuitry in an electronic device. Reducing the time for testing the electronic device saves the device manufacturer and end-user both time and money.

SUMMARY OF THE INVENTION

A method for generating an optimal serial test pattern for sequence detection is described. The serial test pattern comprises a first plurality of bits and is generated by a pattern generator. The method comprises generating a second plurality of bits having a first value and a least significant bit. The second plurality of bits includes less bits than the first plurality of bits. The first value of the second plurality of bits is then compared with at least one number. A next bit is then generated in the serial pattern. If the first value of the second plurality of bits is equal to the at least one number, the next bit has a same state as the least significant bit in the second plurality of bits. If the second plurality of bits is not equal to the at least one number, the next bit has a complement state of the least significant bit in the second plurality of bits. For one embodiment, the second plurality of bits comprises n bits, and the at least one number comprises one through $2^{n-1}$ inclusive. For another embodiment, the at least one number comprises $2^{n-1}-1$ through $2^n-2$ inclusive.

A pattern generator is also described. The pattern generator comprises a sequence generator outputting a serial sequence of bits and a plurality of bits having a value. The sequence generator is coupled to a comparator. The comparator generates a comparison result in response to a comparison of the value of the plurality of bits and at least one number. The pattern generator further comprises a next bit generator that receives the comparison result and one of the plurality of bits from the sequence generator. In response to the comparison result and one of the plurality of bits, the next bit generator generates a next bit for the serial sequence of bits. For one embodiment, the comparison result is a first result value when the plurality of bits is equal to the at least one number, and the comparison result is a second result value when the plurality of bits is not equal to the at least one number. For this embodiment, the next bit has a same state as one of the plurality of bits if the comparison result is the first result value, and the next bit has a complement state of one of the plurality of bits if the comparison result is the second result value.

Other features and advantages of the present invention will be apparent from the accompanying drawings and from the detailed description that follows.

BRIEF DESCRIPTION OF THE DRAWINGS

The features and advantages of the present invention are illustrated by way of example and are by no means intended to limit the scope of the present invention to the particular embodiments shown.

DETAILED DESCRIPTION

A method and apparatus for generating an optimal test pattern for sequence detection is described. In the following description, for purposes of explanation, specific nomenclature is set forth to provide a thorough understanding of the present invention. However, it will be apparent to one skilled in the art that these specific details are not required to practice the present invention. In other instances, well known circuits and devices are shown in block diagram form to avoid obscuring the present invention unnecessarily.

Figure 1:
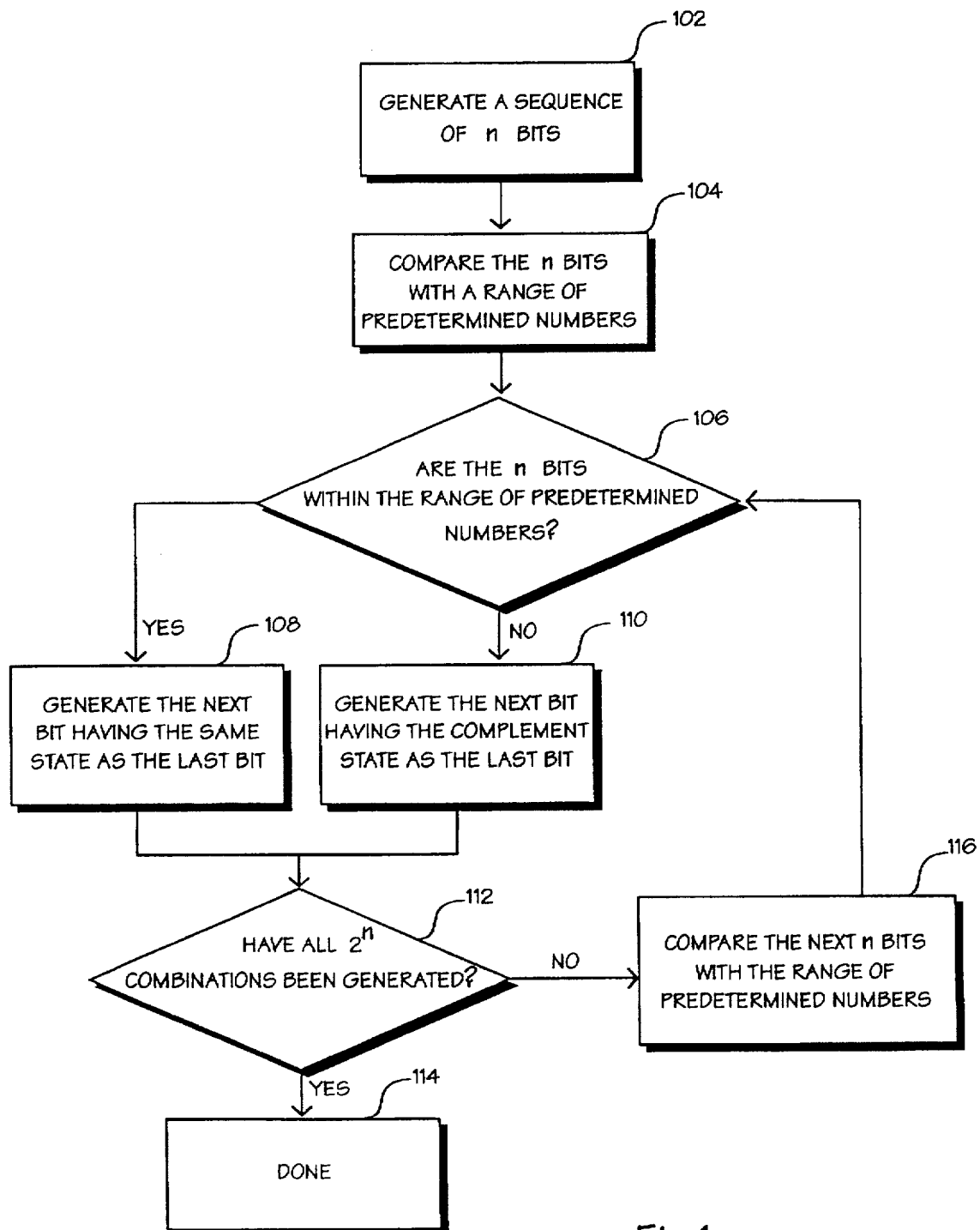
FIG. 1 is a flow chart illustrating a method of generating a test pattern according to one embodiment of the present invention.

FIG. 1 is a flow chart which outlines the general steps required to generate an optimal test pattern for testing a sequence detecting state machine or other circuitry under test in an electronic device. The method or process illustrated in FIG. 1 generates an optimal serial test pattern of bits which comprises all $2^n$ possible combinations of an n-bit pattern. The optimal serial pattern comprises only $2^n+n-1$ bits the first time the serial test pattern is generated. If the serial test pattern is repeated, only $2^n$ cycles are required to reproduce the serial test pattern. All $2^n$ combinations of an n-bit pattern appear in the serial test pattern one time only.

As described in more detail below, the method may be implemented by a pattern generator circuit or other digital signal processing device. Alternatively, the method of FIG. 1 may comprise a sequence of software instructions which causes circuitry to generate an optimal serial test pattern as outlined in FIG. 1.

The method of generating an optimal serial test pattern starts by generating a first sequence of n bits at step 102. For one embodiment, the first sequence of n bits comprises bits generated after a reset function of a pattern generator.

The first sequence of n bits has a value that may be expressed in base 10, hexadecimal, or other number formats. For purposes of illustration, and not by way of limitation, base 10 is used throughout this description.

At step 104, the first sequence of n bits is compared with a range of predetermined numbers. The range of predetermined numbers may comprise one number or a plurality of numbers.

For one embodiment, the range of predetermined numbers is from one to $2^{n-1}$ inclusive. For another embodiment, the range of numbers comprises zero and the range of $2^{n-1}+1$ to $2^n$ inclusive. For another embodiment, the range of predetermined numbers is from $2^{n-1}-1$ to $2^n-2$ inclusive. For another embodiment, the range of predetermined numbers comprises 0 to $2^{n-1}-2$ and $2^n-1$ to $2^n$ inclusive.

At step 106, the method determines whether the value of the first sequence of n bits is included within the range of predetermined numbers. If the value of the first sequence of n bits is included within the set of predetermined numbers, the method transitions to step 108 and generates the next bit in the pattern. The next bit in the pattern will have the same state as the last or least significant bit of the first sequence of n bits.

If the value of the first sequence of n bits is not included within the range of predetermined numbers, the method transitions from step 106 to step 110 and generates the next bit in the pattern. The next bit in the pattern will have the complement state of the last or least significant bit of the first sequence of n bits.

For another embodiment, the next bit may have a state which is logically derived from the state of another bit or bits in the first sequence of bits.

Both steps 108 and 110 transition to step 112 after the next bit in the pattern has been generated. If all $2^n$ combinations for the n-bit pattern have been generated, the process stops at step 114. If all $2^n$ combinations for the n-bit pattern have not been generated, the process compares the next group of n bits with the range of predetermined numbers at step 116. The next group of n bits is the first sequence of n bits shifted by one location and having a least significant bit equal to the next bit determined in step 108 or step 110. The process then transitions back to step 106.

For another embodiment, the process does not stop if all $2^n$ combinations of the n-bit pattern have been generated; rather, the process continues to cycle through the unique serial test pattern generated by the process of FIG. 1.

The operation of the method shown in FIG. 1 may best be illustrated by way of example. For one example, n equals three and the method of FIG. 1 generates the following optimal serial sequence of bits: 0001110100. Reading three bit groups from left to right, this pattern covers the three-bit patterns from zero to seven in the order of: 0, 1, 3, 7, 6, 5, 2, and 4. The pattern is cyclical and will repeat itself.

The sequence of bits may be output from a pattern generator circuit or other circuit from left to right or from right to left. The method of FIG. 1 generates this pattern as follows.

At step 102, a first sequence of three bits is generated. The first sequence of three bits comprises 000. These bits may be generated by performing a reset function within the pattern generator. Given that the above pattern is cyclical, any three bits of the serial sequence may comprise the first sequence of three bits. For this example, the first three bits comprise 000.

At step 104, 000 is compared with the predetermined range of numbers from one to $2^{n-1}$, that is, a range from one to four ({1,4}) inclusive. At step 106, it is determined that 000 (zero) is not within the range {1,4} and the process proceeds to step 110. At step 110, the next bit is determined to be the complement of the last or least significant bit in the first sequence of 000. Reading from left to right, the last bit in the sequence is a zero. Therefore, the next bit in the pattern is set to be a one.

At step 112, it is determined that not all of the eight ($2^3$) combinations of the three-bit pattern have been generated, and the process transitions to step 116. At step 116, the next three bits are compared with the range {1,4}. The next three bits now comprise 001 and have the decimal value of one. Step 106 determines that the value one is within the range {1,4} and the process transitions to step 108. At step 108, the next bit in the pattern is generated and has the same state as the last or least significant bit. Reading from left to right, the last bit in the sequence is a one. Therefore, the next bit in the pattern is set to be a one.

The process will continue until all eight ($2^3$) combinations of the three-bit pattern have been generated. A summary of this example is illustrated in Table 1.

TABLE 1

| n bits | base 10 | last bit | next bit |
| --- | --- | --- | --- |
| 000 | 0 | 0 | 1 |
| 001 | 1 | 1 | 1 |
| 011 | 3 | 1 | 1 |
| 111 | 7 | 1 | 0 |
| 110 | 6 | 0 | 1 |
| 101 | 5 | 1 | 0 |
| 010 | 2 | 0 | 0 |
| 100 | 4 | 0 | 0 |

For another example, n equals three and the method illustrated in FIG. 1 generates the following serial test pattern: 1110001011. This serial test pattern is the complement of the pattern 0001110100 illustrated in the first example. Reading three bit groups from left to right, the pattern 1110001011 covers the three-bit patterns from zero to seven in the order of: 7, 6, 4, 0, 1, 2, 5, and 3. The pattern is cyclical and will repeat itself. Thus, the test pattern could be shifted to comprise 0001011100 so that the three-bit patterns are in the order of: 0, 1, 2, 5, 3, 7, 6, and 4.

The pattern may be output from a pattern generator circuit or other circuit from left to right or from right to left. The method of FIG. 1 generates this pattern as follows.

At step 102, a first sequence of three bits is generated. The first sequence of three bits comprises 111. These bits may be generated by performing a reset function within the pattern generator. The above pattern is cyclical such that any three bits may comprise the first sequence of three bits. For this example, the first three bits comprise 111.

At step 104, 111 is compared with the range of predetermined numbers from $2^{n-1}-1$ to $2^n-2$ inclusive, that is, a range from three to six ({3,6}) inclusive. The bit pattern 111 has the decimal value of seven. At step 106, it is determined that 111 (seven) is not within the range {3,6} and the process proceeds to step 110. At step 110, the next bit is determined to be the complement of the last or least significant bit in the first sequence of 111. Reading from left to right, the last bit in the sequence is a one. Therefore, the next bit in the pattern is set to be a zero.

At step 112, it is determined that not all of the eight ($2^3$) combinations of the three-bit pattern have been generated, and the process transitions to step 116. At step 116, the next three bits are compared with the range {3,6}. The next three bits now comprise 110. These three bits have the decimal value of six. Step 106 determines that six is within the range {3,6} and the process transitions to step 108. At step 108, the next bit in the pattern has the same state as the last or least significant bit. Reading from left to right, the last bit in the sequence is a zero. Therefore, the next bit in the pattern is set to be a zero.

The process will continue until all eight ($2^3$) combinations of the three-bit pattern have been generated. A summary of this example is illustrated in Table 2.

TABLE 2

| n bits | base 10 | last bit | next bit |
| --- | --- | --- | --- |
| 111 | 7 | 1 | 0 |
| 110 | 6 | 0 | 0 |
| 100 | 4 | 0 | 0 |
| 000 | 0 | 0 | 1 |
| 001 | 1 | 1 | 0 |
| 010 | 2 | 0 | 1 |
| 101 | 5 | 1 | 1 |
| 011 | 3 | 1 | 1 |

The foregoing method illustrated in FIG. 1 may be extended to any n-bit pattern having $2^n$ combinations. The unique serial test pattern generated by the method of FIG. 1 will comprise $2^n+n-1$ bits. If the pattern is repeated or cycled, then only $2^n$ bits will be generated to repeat each of the $2^n$ combinations. All $2^n$ combinations will appear in this serial test pattern one time only.

For another example, when n equals four and the predetermined range of numbers comprises the range 1 to $2^{n-1}$ or {1,8}, the test pattern generated by the method illustrated in FIG. 1 is: 0000111101011001000. This pattern covers the four-bit patterns from zero to fifteen in the order of: 0, 1, 3, 7, 15, 14, 13, 10, 5, 11, 6, 12, 9, 2, 4 and 8. This pattern is cyclical and will repeat itself.

For another example, when n equals four and the predetermined set of numbers comprises the range $2^{n-1}-1$ to $2^n-2$ or {7,14}, the test pattern generated by the method illustrated in FIG. 1 is: 1111000010100110111. This pattern is the complement of the pattern 0000111101011001000 illustrated in the first example. The pattern 1111000010100110111 covers the four-bit patterns from zero to fifteen in the order of: 15, 14, 12, 8, 0, 1, 2, 5, 10, 4, 9, 3, 6, 13, 11, and 7. This pattern is cyclical and will repeat itself.

Figure 2:
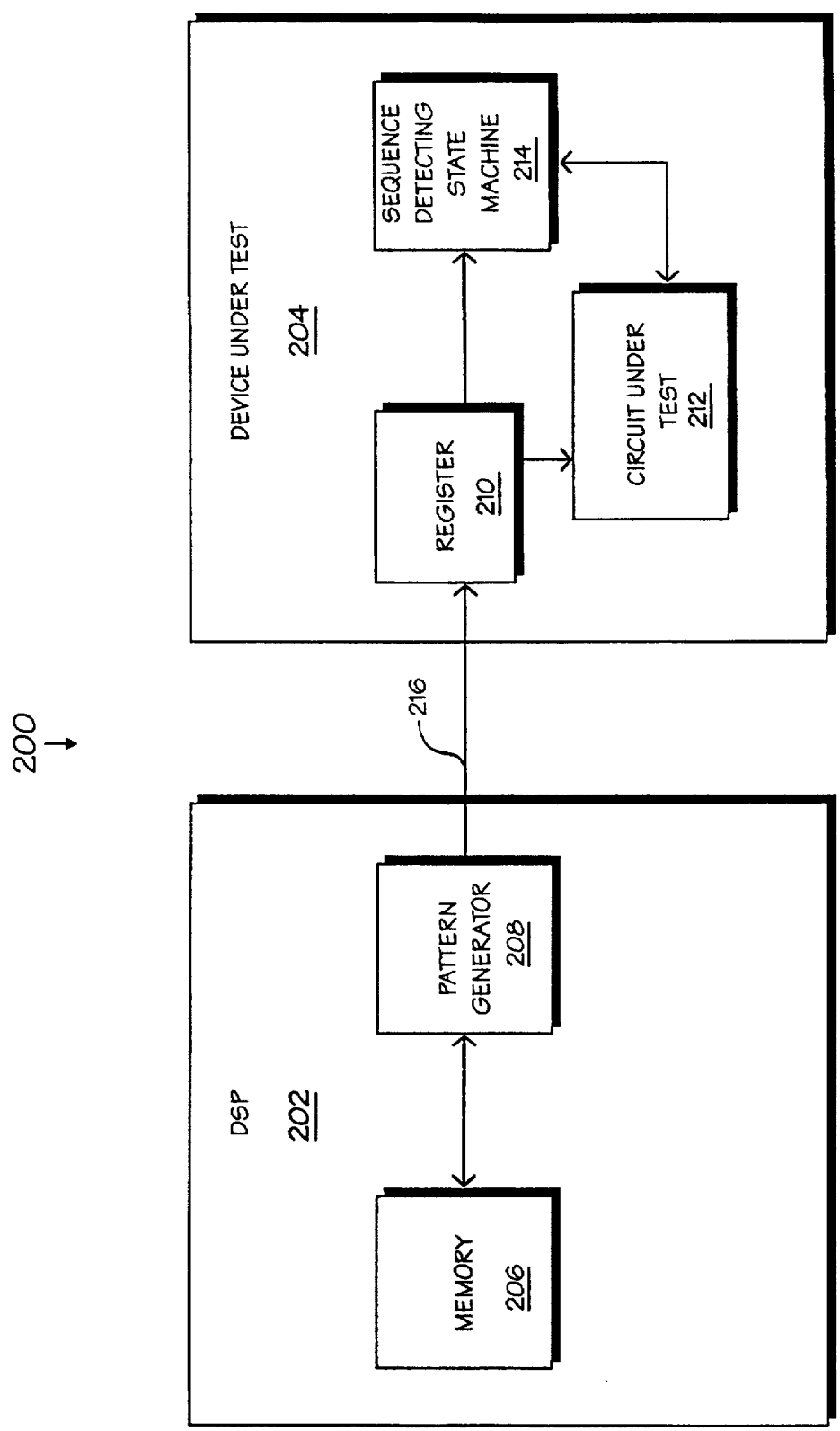
FIG. 2 is a block diagram of one embodiment of the present invention.

The method of FIG. 1 may be implemented in system 200 shown in FIG. 2. System 200 includes a digital signal processing device (DSP) 202 communicating with device under test 204. DSP 202 generates the optimal serial test pattern described in FIG. 1 for testing device under test 204. DSP 202 may comprise a logic analyzer, automatic testing equipment (ATE) used in integrated circuit production testing, a signal generator, a computer, or other type of digital signal processor that can generate a pattern of bits or signals. Alternatively, DSP 202 may comprise a circuit simulator which generates inputs for testing a circuit model of device under test 204.

DSP 202 includes pattern generator 208 and memory 206. Pattern generator 208 may comprise circuitry that can implement a pattern. For example, pattern generator 208 may comprise programmable logic device(s) such as PLDs, FPGAs, or other types of programmable logic that can be programmed to implement the method illustrated in FIG. 1. Alternatively, pattern generator 208 may comprise dedicated hardware or circuitry that generates the method illustrated in FIG. 1. Embodiments of pattern generator 208 will be described in more detail below.

Memory 206 is a medium that stores a series of instructions which cause pattern generator 206 and DSP 202 to implement or perform the method illustrated in FIG. 1. For one embodiment, memory 206 is RAM including SRAM, DRAM, VRAM or other types of RAM memory. For another embodiment, memory 206 is a ROM, PROM, EPROM, EEPROM or other types of ROM memory. For another embodiment, memory 206 is FLASH memory. For another embodiment, memory 206 is a programmable logic device including PLDs, FPGAs, or other types of programmable logic that can implement a state machine according to the method illustrated in FIG. 1.

For yet another embodiment, memory 206 is a floppy disk, hard drive, or other type of magnetic storage medium.

Alternatively, memory 206 may comprise a digital compact disk, optical disk or any other type or storage medium.

Device under test 204 has a serial input for receiving the serial test pattern on line 216 from DSP 202. Device under test 204 includes register 210 which is coupled to line 216. Register 210 receives and stores the serial test pattern generated by DSP 202. For one embodiment, register 210 has n bit locations for storing n bits in the serial test pattern. For this embodiment, $2^n$ possible combinations can be represented by the n bits in register 210. For another embodiment, register 210 stores more or less than n bits at one time.

Device under test 204 also includes sequence detecting state machine 214 and circuit under test 212. For one embodiment, only one of sequence detecting state machine 214 or circuit under test 212 is included within device under test 204.

Sequence detecting state machine 214 monitors and evaluates n bits of the serial test pattern stored in register 210. When a particular pattern is detected by sequence detecting state machine 214, device under test 204 will perform a given action. In the example outlined above where n equals three and the serial test pattern comprises the pattern: 0001110100, sequence detecting state machine 214 monitors three bits at any given time. For one embodiment, sequence detecting state machine 214 monitors the sequence for the pattern 011. When this three-bit pattern is loaded into register 210, sequence detecting state machine 214 causes device under test 204 to perform an action (e.g. load input data, or write data into memory location in device under test 204, etc.). This action may then be monitored by testing device under test 204 to see if the action correctly took place. In this embodiment, all other patterns besides 011 should not cause device under test 204 to perform any action. Device under test 204 may also be tested to ensure that no action occurs in response to other patterns.

For one embodiment, sequence detecting state machine 214 may comprise a data communication device communicating with DSP 202. Device under test 204 will receive communication packets which have header data or other frame initializing data. Sequence detecting state machine 214 will monitor the incoming data stored in register 210 until a unique n-bit sequence is encountered which identifies the particular header or frame initializer. Therefore, the functionality of the data communication device may be tested by having DSP 202 implement the method of FIG. 1. According to the method of FIG. 1, an optimally short serial stream of bits comprising all possible n-bit patterns will be supplied to device under test 204. Device under test 204 will then be tested to make sure that it correctly responds to only the n-bit pattern which has the header or frame initializing data.

Circuit under test 212 also monitors and evaluates n bits stored in register 210. When a particular pattern is detected by circuit under test 212, circuit under test 212 will perform an action. For example, device under test 204 may comprise a memory device such as a static random access memory device (SRAM), circuit under test 212 may comprise row or column decoders, and register 210 may comprise an address register having n bits. Register 210 can produce $2^n$ addresses for addressing $2^n$ memory locations. The method of FIG. 1 can be used to serially load all $2^n$ addresses into register 210 and test whether all memory locations can be properly addressed. Alternatively, register 210 may comprise a data register in a memory device. Register 210 may then be loaded with all $2^n$ combinations of data to verify that all such combinations may be written into a particular memory location.

Any device or system that uses an address may use the method of FIG. 1 and the system of FIG. 2 to quickly load and test the selection of all address locations. Moreover, any device that uses a data register or a data field will benefit from the savings in test time associated with using the method illustrated in FIG. 1.

For another embodiment, device under test 204 comprises an integrated circuit or system having a serial test interface. For this embodiment, register 210 may comprise an instruction register, address register, data register, or other register element. If register 210 is an instruction register, the response of device under test 204 to all instructions may be quickly verified. A first instruction may loaded with a first n bits and the response of device under test 204 monitored. A next instruction may then be loaded into register 210 in only one clock cycle. The entire instruction register does not have to be reloaded with a new instruction. This process can then continue until all instructions have been loaded, and only $2^n+n-1$ clock cycles are required to load all of the instructions the first time. The functionality of the data registers, address registers, and other registers may be also be tested in like manner.

For one embodiment, the serial test interface may be compatible with IEEE Std 1149.1-1990 and 1149.1a-1993 entitled IEEE Standard Test Access Port and Boundary-Scan Architecture (IEEE Std 1149.1), ISBN 1-55937-350-4, which is commonly referred to as the JTAG (Joint Test Access Group) specification.

For one embodiment, register 210 is not required and sequence detecting state machine 214 or circuit under test 212 may directly receive the serial input pattern from DSP 202 via line 216.

For another embodiment, pattern generator 208 may be included within device under test 204. For this embodiment, device under test 204 may include a built-in self-test circuit (BIST) such that pattern generator 208 provides the serial test pattern generated by the method of FIG. 1 in response to a stimulus. The stimulus may be an external signal or voltage which causes the built-in self-test circuit to start functioning. In this embodiment, pattern generator 208 would provide the serial test pattern directly to register 210, sequence detecting state machine 214, or circuit under test 212.

Figure 3:
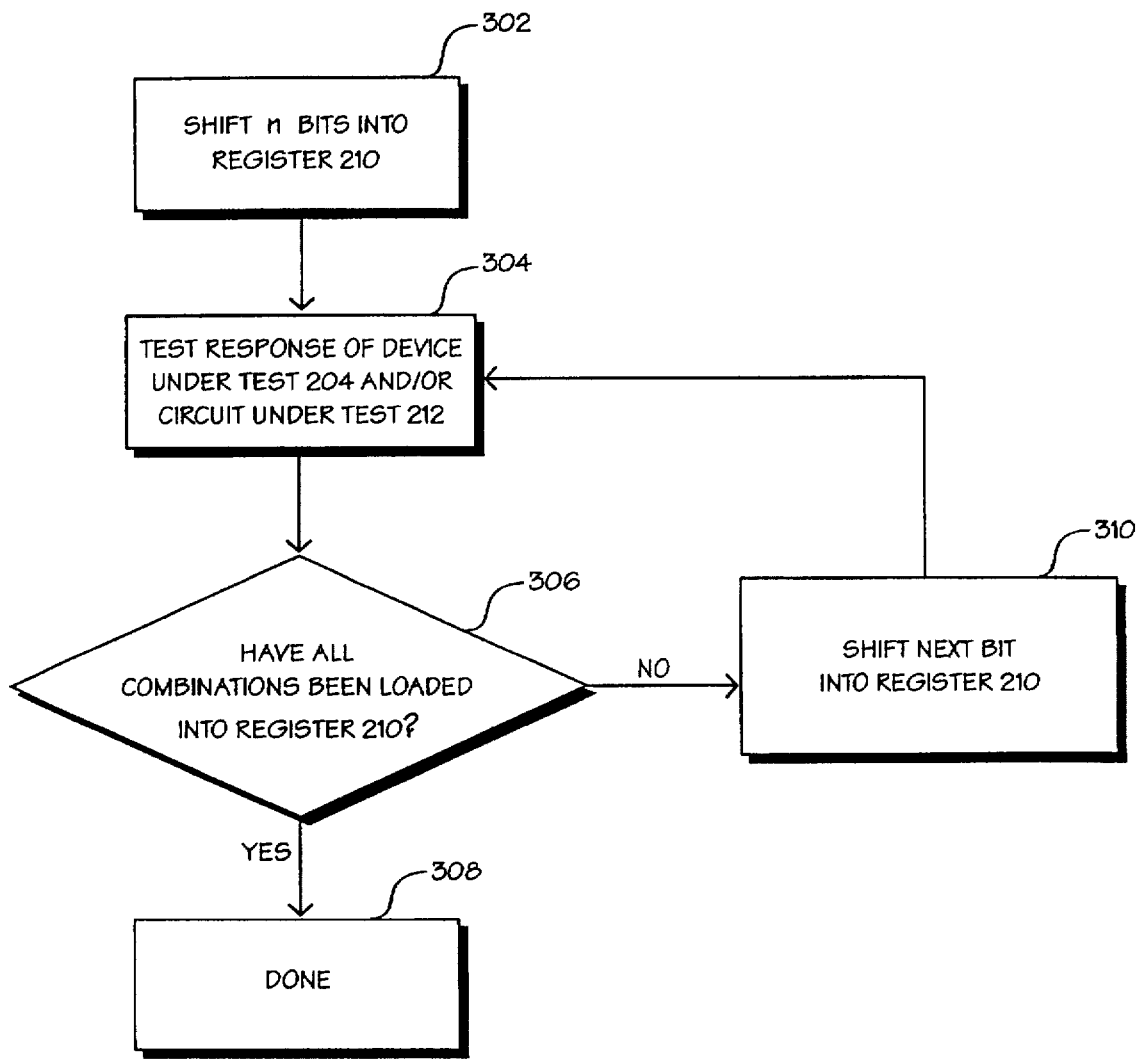
FIG. 3 is a flow chart illustrating a method of using the test pattern for testing a device according to one embodiment of the present invention.

The operation of the system 200 may be summarized as illustrated in FIG. 3. At step 302, n bits of the optimal serial test pattern generated in FIG. 1 are loaded into register 210. Sequence detecting state machine 214 and/or circuit under test 212 monitor and evaluate the n bits in register 210. At step 304, the response of device under test 204 is monitored. The response may be monitored by another device communicating with device under test 204, or by monitoring the outputs of device under test 204.

At step 306, it is determined whether all $2^n$ combinations of n-bit patterns have been loaded into register 210. If all $2^n$ combinations have not been loaded into register 210, then the next bit in the serial test pattern sequence is shifted into register 210. The next bit is determined by the method illustrated in FIG. 1. A new n-bit pattern now resides in register 210. Steps 304, 306, and 310 are repeated until all $2^n$ combinations of n-bit patterns have been loaded into register 210 and the response by device under test 204, sequence detecting state machine 214, or circuit under test 212 has been monitored. When all $2^n$ combinations have been loaded into register 210, the process stops at step 308.

Figure 4:
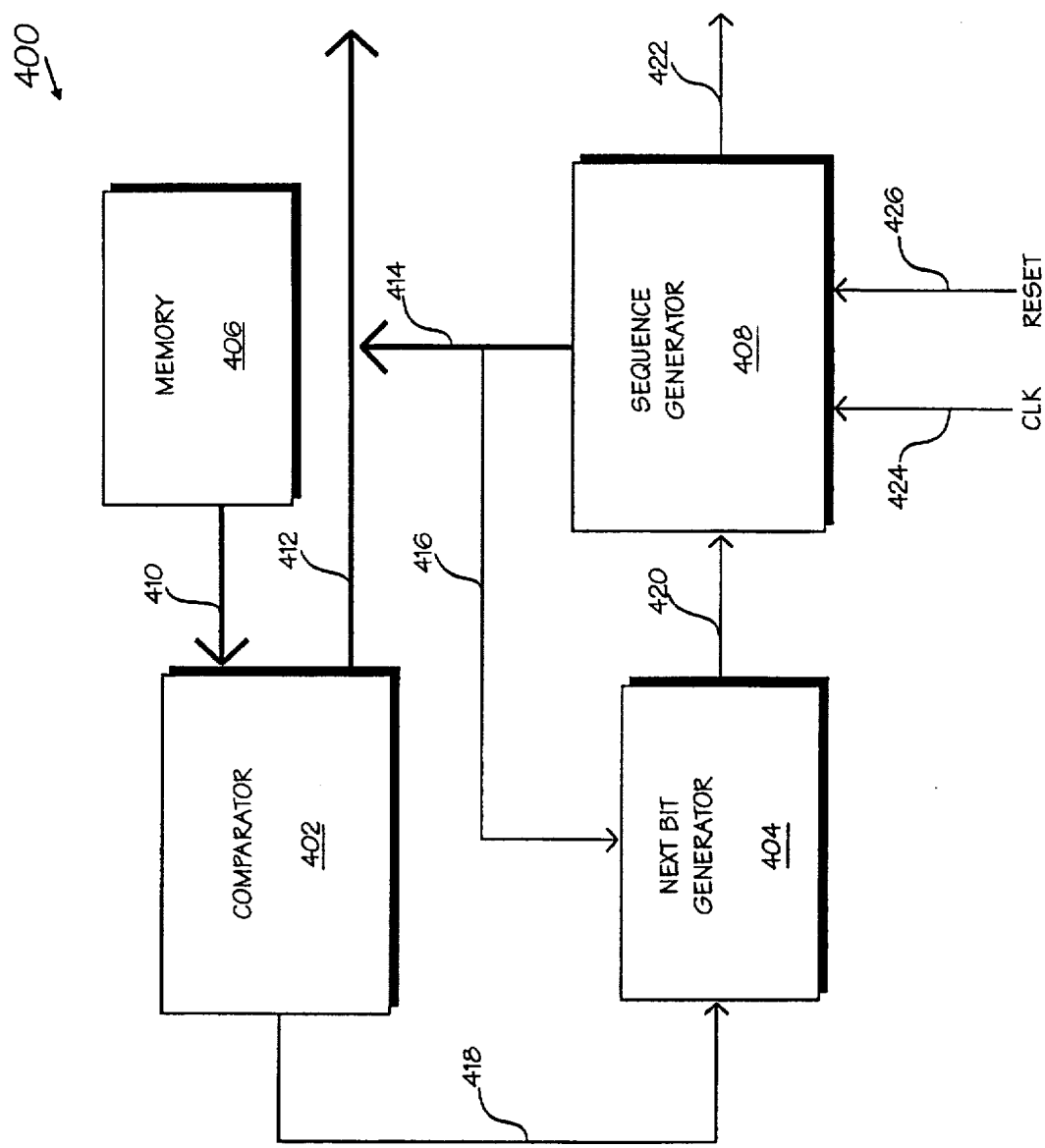
FIG. 4 is a block diagram of one embodiment of a pattern generator according to the present invention.

FIG. 4 illustrates pattern generator 400 which is one embodiment of pattern generator 208 illustrated in FIG. 2.

Pattern generator 400 implements the method of FIG. 1. Pattern generator 400 includes sequence generator 408. Sequence generator 408 outputs the serial test pattern to serial output line 422 in response to the clock signal CLK on line 424. Serial output line 422 may comprise line 216 in FIG. 2. Sequence generator 408 also outputs n-bit parallel data on bus 414. Bus 414 is coupled to bus 412.

Pattern generator 400 also includes comparator 402 receiving input data from memory 406 over bus 410 and parallel n-bit data from sequence generator 408 over bus 412. Comparator 402 outputs a comparison result signal on line 418 to next bit generator 404. Next bit generator 404 receives the comparison result signal on line 418. Next bit generator 404 also receives on line 416 one of n bits in the n-bit pattern generated by sequence generator 408. Next bit generator 404 outputs a next bit on line 420 to sequence generator 408.

The operation of pattern generator 400 will be described with reference to FIG. 1.

At step 102, pattern generator 400 generates an initial n-bit sequence of bits or signals for the serial test pattern. The initial n-bit pattern is provided in parallel onto bus 412 and may be serially clocked out of sequence generator 408 onto serial output line 422 in response to CLK on line 424. The initial pattern may be a default state that occurs in response to the reset signal on line 426. For one embodiment the initial pattern is all zeros. For another embodiment, the initial pattern is all ones.

At step 104, comparator 402 compares a value of the n-bit pattern on bus 412 with a range of predetermined numbers provided by memory 406 on bus 410. Memory 406 may comprise RAM, ROM or any other type of storage medium for storing the predetermined range of numbers.

For one embodiment, the range of predetermined numbers is from one to $2^{n-1}$ inclusive. For another embodiment, the range of numbers comprises zero and the range of $2^{n-1}+1$ to $2^n$ inclusive. For another embodiment, the range of predetermined numbers is from $2^{n-1}-1$ to $2^n-2$ inclusive. For another embodiment, the range of predetermined numbers comprises 0 to $2^{n-1}-2$ and $2^n-1$ to $2^n$ inclusive.

At step 106, comparator 402 determines whether the value of the first sequence of n bits is included within the range of predetermined numbers. Comparator 402 outputs the comparison result signal on line 418 is response to the comparison. For one embodiment, the comparison result signal is a high logic state (one) if the n-bit pattern is not within the range of numbers in memory 406, and the comparison result signal is a low logic state (zero) if the n-bit pattern is within the range of numbers in memory 406. For another embodiment, the comparison result signal is a low logic state if the n-bit pattern is not within the range of numbers in memory 406, and the comparison result signal is a high logic state if the n-bit pattern is within the range of numbers in memory 406.

If the value of the first sequence of n bits is included within the range of predetermined numbers, the method transitions to step 108 and next bit generator 404 generates the next bit in the pattern. Next bit generator 404 generates the next bit on line 420 in response to the comparison result signal on line 418 and one of the bits on line 416. For one embodiment, the next bit will have a same state as the last or least significant bit of the first sequence of n bits.

If the value of the first sequence of n bits is not included within the range of predetermined numbers, the method transitions to step 110 and next bit generator 404 generates the next bit in the pattern. Next bit generator 404 generates the next bit on line 420 in response to the comparison result signal on line 418 and one of the bits on line 416. For one embodiment, the next bit in the pattern will have the complement state of the last or least significant bit of the first sequence of n bits.

For another embodiment, the next bit may have a state which is logically derived from the state of another bit or bits in the first sequence of bits.

In response to the next clock pulse on line 424, sequence generator 408 will output one of the n bits on serial output line 422 and clock the next bit into the least significant bit location on bus 414.

Both steps 108 and 110 transition to step 112 after next bit generator 404 has generated the next bit on line 420. If all $2^n$ combinations for the n-bit pattern have been generated, the process stops at step 114. If all $2^n$ combinations for the n-bit pattern have not been generated, comparator 402 compares the next group of n bits on bus 412 with the range of predetermined numbers on bus 410 at step 116. The next group of n bits is the first sequence of n bits shifted by one location and having a least significant bit equal to the next bit determined in step 108 or step 110. The process then transitions back to step 106.

For another embodiment, the process does not stop if all $2^n$ combinations of the n-bit pattern have been generated; rather, the process continues to cycle through the unique pattern generated by the process of FIG. 1.

Figure 5:
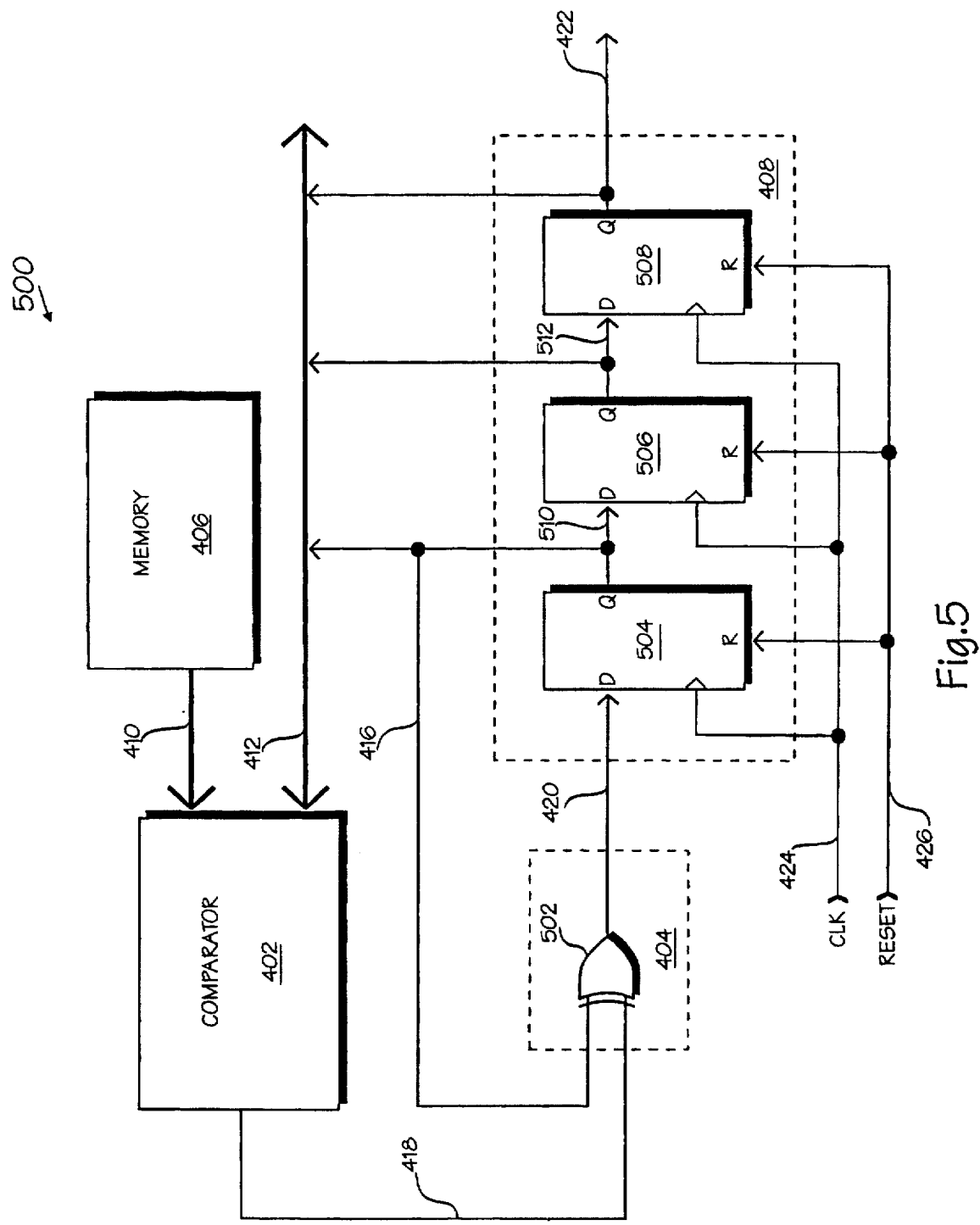
FIG. 5 is a circuit diagram of another embodiment of a pattern generator according to the present invention.

FIG. 5 illustrates pattern generator 500 which is one embodiment of pattern generator 400 illustrated in FIG. 4. Pattern generator 500 includes next bit generator 404 which comprises exclusive or (XOR) gate 502. Additionally, pattern generator 500 includes sequence generator 408 which comprises D-type registers 504, 506, and 508. Registers 504, 506, and 508 output a three-bit pattern to bus 412 and output the serial test pattern onto serial output line 422.

Each of registers 504, 506, and 508 receive the clock signal CLK on line 424 and the reset signal on line 426. Register 504 has its D input coupled to receive the next bit on line 420 from XOR gate 502. The Q output of register 504 is coupled to bus 412 and line 416. Line 416 is one input to XOR gate 502. The other input of XOR gate 502 receives the comparison result signal from comparator 402 on line 418.

Register 504 has its Q output coupled to the D input of register 506 on line 510. The Q output of register 506 is coupled to the D input of register 508 and bus 412 on line 512. The Q output of register 508 is coupled to serial output line 422 and bus 412. It will be appreciated that the serial test pattern may be output not only from serial output line 422, but also from line 510 or line 512. Alternatively, the serial test pattern may be output from line 420.

The operation of pattern generator 500 will be described with reference to FIG. 1. For this example, n equals three and the test pattern generated by FIG. 1 is 0001110100.

At step 102, the reset signal on line 426 is set to a high logic state in order to reset the Q outputs of registers 504, 506, and 508 to a low logic state. Thus, the initial three-bit pattern is 000 which is present on nodes 422, 512, and 510, respectively. As the next bit is clocked into register 504, the previous n bits will be clocked out toward serial output line 422.

At step 104, comparator 402 compares 000 on bus 412 with a range of predetermined numbers from memory 406 on bus 410. For this embodiment, the range of predetermined numbers is from one to $2^n-1$ or {1.4} inclusive.

At step 106, comparator 402 determines that zero (000) is not within the range {1,4}, and comparator 402 outputs a comparison result signal on line 418 having a high logic state.

At step 110, XOR gate 502 receives the high logic state on line 418 and the low logic state on line 416 and generates a next bit on line 420 having a high logic state. Thus, the next bit on line 420 is the complement of the last or least significant bit on line 510 and line 416.

In response to the next clock pulse on line 424, sequence generator 408 will output 001 on lines 422, 512, and 510, respectively.

At step 112, it is determined that not all of the eight ($2^3$) combinations of the three-bit pattern have been generated, and the process transitions to step 116. At step 116, the next three bits are compared with the range {1,4} by comparator 402. The next three bits now comprise 001 and have a decimal value of one.

At step 106, comparator 402 determines that 001 is within the range {1,4} and outputs a comparison result signal on line 418 having a low logic state.

At step 108, XOR gate 502 receives the low logic state on line 418 and the high logic state on line 416 and generates a next bit on line 420 having a high logic state. Thus, the next bit on line 420 is the same state of the last or least significant bit on line 510 and line 416.

In response to the next clock pulse on line 424, sequence generator 408 will output 011 on lines 422, 512, and 510, respectively.

The process will continue through steps 106, 108, 110, 112, and 116 until all eight ($2^3$) combinations for the three-bit pattern have been generated by sequence generator 408. A full summary of the serial pattern generation is illustrated in Table 1 above.

It will be appreciated that the circuits illustrated in FIG. 5 for next bit generator 404 and sequence generator 408 may be replaced with other circuits as is generally known in the art to achieve the same function as pattern generator 500. Additionally, the circuits illustrated in FIG. 5 may be altered as generally known in the art to respond to other ranges of numbers described in this application.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A method for generating a serial pattern comprising a first plurality of bits, the method comprising the steps of:

(A) generating a second plurality of bits having a first value and a least significant bit, wherein the second plurality of bits includes less bits than the first plurality of bits;

(B) comparing the first value with at least one number;

(C) if the first value is equal to the at least one number, then generating a next bit in the serial pattern having a same state as the least significant bit in the second plurality of bits; and (D) if the first value is not equal to the at least one number, then generating the next bit in the serial pattern having a complement state of the least significant bit in the second plurality of bits.

* * * * *